United States Patent
Seok et al.

(10) Patent No.: US 11,335,876 B2
(45) Date of Patent: May 17, 2022

(54) ORGANIC LIGHT EMITTING DIODE, ORGANIC LIGHT EMITTING DIODE DISPLAY DEVICE AND DISPLAY DEVICE FOR VEHICLES USING THE SAME

(71) Applicant: LG Display Co., Ltd., Seoul (KR)

(72) Inventors: Han-Byeol Seok, Seoul (KR);
Kwan-Soo Kim, Paju-si (KR);
Eun-Jung Park, Goyang-si (KR);
Ki-Min Lim, Goyang-si (KR);
Seung-Kwang Roh, Goyang-si (KR);
Byung-Soo Kim, Goyang-si (KR);
Sang-Kyoung Moon, Ulsan (KR);
Dong-Il Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 413 days.

(21) Appl. No.: 16/455,265

(22) Filed: Jun. 27, 2019

(65) Prior Publication Data

US 2020/0006692 A1  Jan. 2, 2020

(30) Foreign Application Priority Data

Jun. 29, 2018  (KR) ......................... 10-2018-0075967

(51) Int. Cl.
*H01L 51/50* (2006.01)
*G02B 27/01* (2006.01)
*G09G 3/3208* (2016.01)
*H01L 51/52* (2006.01)
(Continued)

(52) U.S. Cl.
CPC ...... *H01L 51/5072* (2013.01); *G02B 27/0149* (2013.01); *G09G 3/3208* (2013.01); *H01L 27/3206* (2013.01); *H01L 51/5004* (2013.01);
*H01L 51/5044* (2013.01); *H01L 51/5203* (2013.01); *H01L 51/5265* (2013.01); *G09G 2300/0426* (2013.01); *H01L 27/3244* (2013.01); *H01L 51/0052* (2013.01);
(Continued)

(58) Field of Classification Search
CPC .......... H01L 2251/552; H01L 51/5044; H01L 27/3206; H01L 51/5072; H01L 51/5203; H01L 2251/5384; H01L 51/5275; H01L 51/5004; H01L 51/5265; H01L 51/0052; H01L 27/3244; H01L 2251/558; H01L 51/0073; G09G 3/3208; G09G 2300/0426; G02B 27/0149
See application file for complete search history.

(56) References Cited

U.S. PATENT DOCUMENTS

2015/0155515 A1  6/2015  Kim et al.
2017/0069865 A1  3/2017  Park
(Continued)

FOREIGN PATENT DOCUMENTS

| CN | 104681580 A | 6/2015 |
| CN | 106531894 A | 3/2017 |
| CN | 108198945 A | 6/2018 |

(Continued)

*Primary Examiner* — Gregory D Clark
(74) *Attorney, Agent, or Firm* — Seed Intellectual Property Law Group LLP

(57) ABSTRACT

Disclosed are an organic light emitting diode, an organic light emitting diode display device and a display device for vehicles using the same. The organic light emitting diode may achieve process simplification and reduction in material costs while maintaining high luminance, through structure change.

22 Claims, 8 Drawing Sheets

(51) Int. Cl.
*H01L 27/32* (2006.01)
*H01L 51/00* (2006.01)

(52) U.S. Cl.
CPC .. *H01L 51/0073* (2013.01); *H01L 2251/5384* (2013.01); *H01L 2251/552* (2013.01); *H01L 2251/558* (2013.01)

(56) References Cited

U.S. PATENT DOCUMENTS

2018/0151819 A1  5/2018  Kim
2019/0280211 A1* 9/2019  Jung ................... H01L 51/0074

FOREIGN PATENT DOCUMENTS

| EP | 3 142 148 A1 | 3/2017 |
|---|---|---|
| JP | 2006-140434 A | 6/2006 |
| JP | 2008-159775 A | 7/2008 |
| JP | 2013-191644 A | 9/2013 |

\* cited by examiner

ORGANIC LIGHT EMITTING DIODE, ORGANIC LIGHT EMITTING DIODE DISPLAY DEVICE AND DISPLAY DEVICE FOR VEHICLES USING THE SAME

CROSS-REFERENCE TO RELATED APPLICATION

This application claims the benefit of Korean Patent Application No. 10-2018-0075967, filed Jun. 29, 2018, which is hereby incorporated by reference as if fully set forth herein.

BACKGROUND

Technical Field

The present disclosure relates to an organic light emitting diode, and more particularly, to an organic light emitting diode which may achieve process simplification and reduction in material costs while maintaining high luminance, and an organic light emitting diode display device and a display device for vehicles using the same.

Description of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

Thereamong, self-luminous display devices which do not require separate light sources and achieve compactness and clear color display, such as an organic light emitting diode display device and a quantum dot display device, are considered as competitive applications.

Recently, because of the above advantages, demand for application of organic light emitting diode display devices to the insides of vehicles is gradually increasing.

If an organic light emitting diode display device is provided in a vehicle, a viewer watching the organic light emitting diode display device is exposed to natural light in the daytime and exposed to dark environments at night and, thus, in order to secure sufficient visibility under strong natural light or dark environments, high efficiency of the organic light emitting diode display device is required.

In order to implement an organic light emitting diode display device having high efficiency, various structures have been proposed, but these structures may increase the number of uses of masks and thus cause increase in process costs and increase in material costs. Further, when the number of organic layers provided between two opposite electrodes in an organic light emitting diode in the organic light emitting diode display device is increased, driving voltage is increased and thus it is difficult to simultaneously acquire low voltage characteristics and high efficiency of the organic light emitting diode display device.

BRIEF SUMMARY

Accordingly, the present disclosure is directed to an organic light emitting diode, an organic light emitting diode display device and a display device for vehicles using the same that substantially obviate one or more problems due to limitations and disadvantages of the related art.

In various embodiments, the present disclosure provides an organic light emitting diode which may achieve process simplification and reduction in material costs while maintaining high luminance even under external light, and an organic light emitting diode display device and a display device for vehicles using the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, in one or more embodiments, an organic light emitting diode includes a first electrode in each of a first region, a second region and a third region, a first common layer on the first electrodes, a first red light emitting layer and a first green light emitting layer respectively in the first region and the second region, a first blue light emitting layer on the first red light emitting layer, the first green light emitting layer and the first common layer throughout the first to third regions, a charge generation layer on the first blue light emitting layer, a second common layer provided on the charge generation layer, a second red light emitting layer and a second green light emitting layer respectively provided on the second common layer in the first region and the second region, a second blue light emitting layer provided on the second red light emitting layer, the second green light emitting layer and the second common layer throughout the first to third regions, a third common layer on the second blue light emitting layer, and a second electrode on the third common layer.

The first blue light emitting layer and the second blue light emitting layer may include a first host which assists excitation, a second host having an electron transporting property, and a blue dopant. The first blue light emitting layer may be in contact with the charge generation layer.

A lowest unoccupied molecular orbital (LUMO) level of the second host may be higher than a LUMO level of the first host by 0.2 eV to 0.5 eV.

The second host may be a compound comprising anthracene as a core and dibenzofuran as a terminal group serving as a host material.

The second host may include one selected from the group consisting of compounds expressed as Chemical formulas 1 to 3 below,

[Chemical formula 1]

[Chemical formula 2]

[Chemical formula 3]

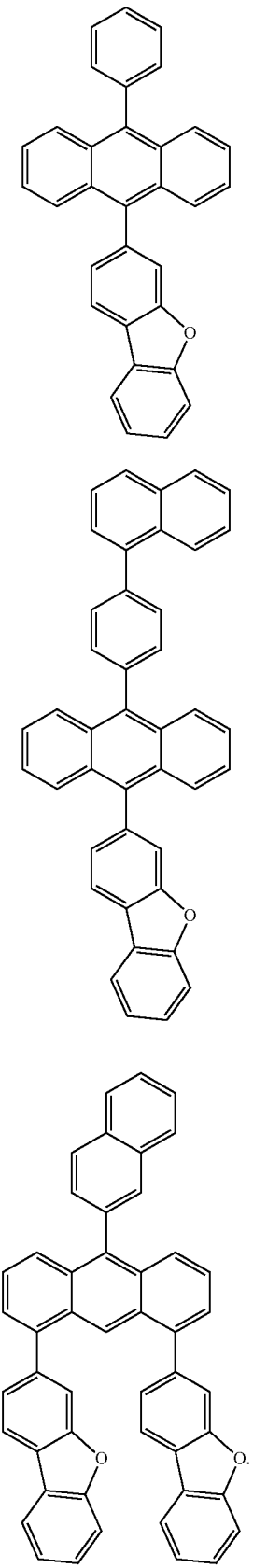

The first and second blue light emitting layers may respectively include 30 vol % or more of each of the first and second hosts.

The first red light emitting layer may have a greater thickness than thicknesses of each of the first green light emitting layer and the first blue light emitting layer, and the second red light emitting layer may have a greater thickness than thicknesses of each of the second green light emitting layer and the second blue light emitting layer.

The thicknesses of each of the first and second blue light emitting layers may be within a range from 150 Å to 400 Å.

The thickness of the first green light emitting layer may not be less than the thickness of the first blue light emitting layer and be 400 Å or less, and the thickness of the second green light emitting layer may not be less than the thickness of the second blue light emitting layer and be 400 Å or less.

The organic light emitting diode may further include a capping layer on the second electrode.

The third common layer may contact the second electrode.

Lower surfaces of the first red light emitting layer, the first green light emitting layer and the first blue light emitting layer may contact an upper surface of the first common layer, in the first to third regions respectively.

The organic light emitting diode may further include a light emitting stack formed by stacking a fourth common layer, a light emitting structure and a fifth common layer, between the third common layer and the second electrode.

The light emitting structure may include a third red light emitting layer and a third green light emitting layer respectively in the first region and the second region, and a third blue light emitting layer on the third red light emitting layer, the third green light emitting layer and the fourth common layer throughout the first to third regions.

In another embodiment of the present disclosure, an organic light emitting diode display device includes a substrate provided with a first region, a second region and a third region, each region having a driving thin film transistor, a first electrode connected to the driving thin film transistor in each of the first region, the second region and the third region, a first common layer on the first electrodes, a first red light emitting layer and a first green light emitting layer respectively provided in the first region and the second region, a first blue light emitting layer on the first red light emitting layer, the first green light emitting layer and the first common layer throughout the first to third regions, a charge generation layer on the first blue light emitting layer, a second common layer provided on the charge generation layer, a second red light emitting layer and a second green light emitting layer respectively on the second common layer in the first region and the second region, a second blue light emitting layer on the second red light emitting layer, the second green light emitting layer and the second common layer throughout the first to third regions, a third common layer on the second blue light emitting layer, and a second electrode on the third common layer.

The first blue light emitting layer and the second blue light emitting layer may include a first host which assists excitation, a second host having an electron transporting property, and a blue dopant. The first blue light emitting layer may be in contact with the charge generation layer.

A lowest unoccupied molecular orbital (LUMO) level of the second host may be higher than a LUMO level of the first host by 0.2 eV to 0.5 eV.

The second host is a compound including anthracene as a core and dibenzofuran as a terminal group serving as a host material.

The organic light emitting diode display device may further include a capping layer in contact with an upper surface of the second electrode.

The organic light emitting diode display device may further include an optical film on the capping layer.

The substrate may be a transparent flexible film, the first electrode may include a reflective electrode, and the second electrode may include one of a transparent electrode layer, a transflective electrode layer, a stack of a plurality of transparent electrode layers, a stack of a plurality of transflective electrode layers, or a stack of transparent electrode and transflective electrode layers.

The organic light emitting diode display device may be attached to at least one of an instrument panel, a head-up display, a front glass, a rear view mirror or a side view mirror of a vehicle, and thus be used as a display device for vehicles.

The driving thin film transistor may receive power from a battery in the vehicle.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
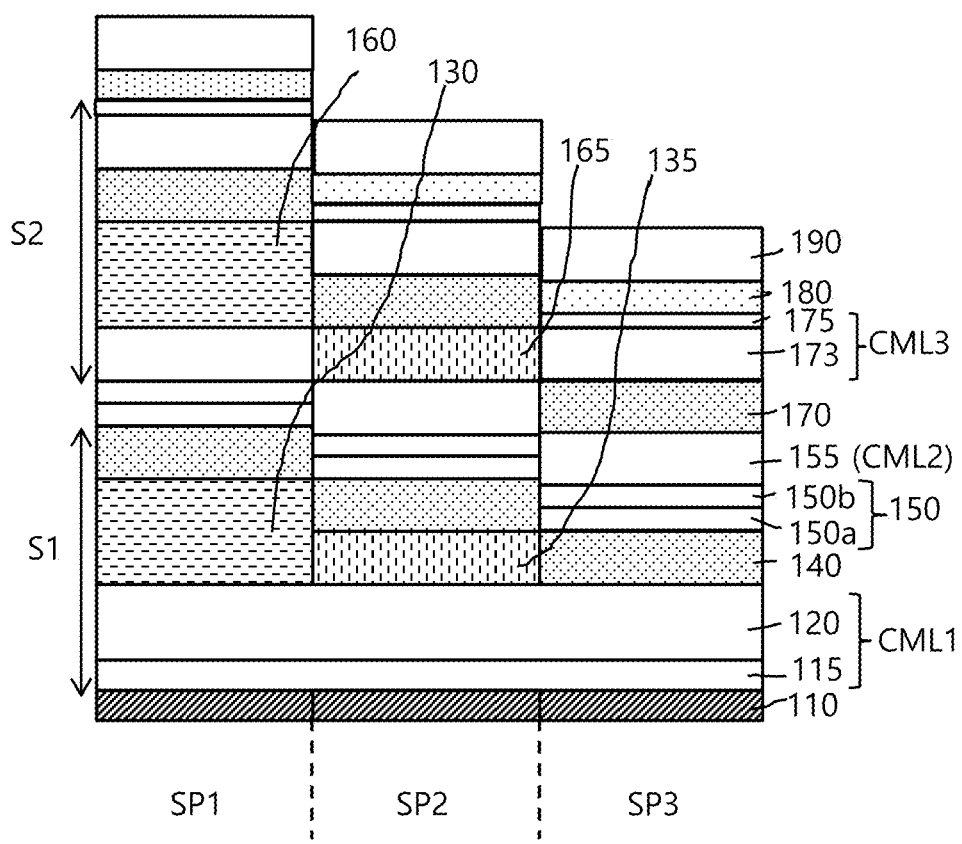
FIG. 1 is a cross-sectional view illustrating an organic light emitting diode in accordance with the present disclosure.

Reference will now be made in detail to the preferred embodiments of the present disclosure, examples of which are illustrated in the accompanying drawings. However, the present disclosure may be embodied in many alternative forms and should not be construed as limited to the embodiments set forth herein, and the embodiments of the present disclosure are provided only to completely disclose the disclosure and to completely inform those skilled in the art of the scope of the disclosure. Further, the names of elements used in the following description of the embodiments of the present disclosure are selected in consideration of ease in preparation of the specification, and may thus differ from the names of parts of an actual product.

Shapes, sizes, rates, angles, numbers, etc. disclosed in the drawings to describe the embodiments of the present disclosure are only exemplary and do not limit the present disclosure. In the following description of the embodiments and the drawings, the same or similar elements are denoted by the same reference numerals even though they are depicted in different drawings. In the following description of the embodiments of the present disclosure, a detailed description of known functions and configurations incorporated herein will be omitted when it may make the subject matter of the present disclosure rather unclear. In the following description of the embodiments, the terms 'including', 'having', 'consisting of', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element includes a plural expression of the element unless stated otherwise.

In interpretation of elements included in the various embodiments of the present disclosure, it will be interpreted that the elements include error ranges even if there is no clear statement.

In the following description of the embodiments, it will be understood that, when positional relations are expressed, for example, when an element is 'on', 'above', 'under', 'beside', etc. another element, the two elements may directly contact each other, or one or more other elements may be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' may encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' may be the same as an element modified by the term 'second' within the technical scope of the disclosure unless stated otherwise.

Characteristics of the various embodiments of the present disclosure may be partially or entirely connected to or combined with each other and technically variously driven and interlocked with each other, and the various embodiments may be independently implemented or be implemented together in connection with each other.

Figure 2:
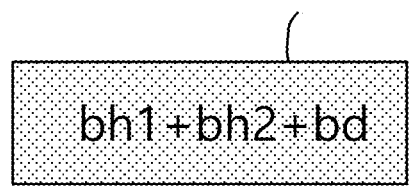
FIG. 2 is a view illustrating the composition of a first or second blue light emitting layer.
Figure 3:
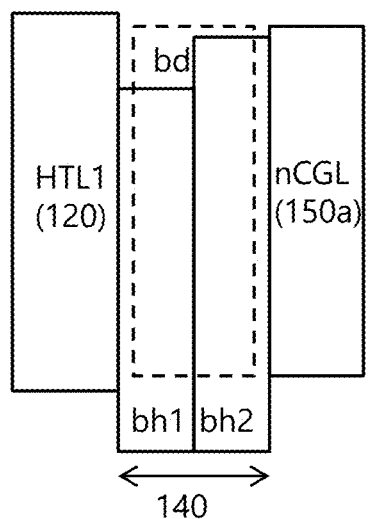
FIG. 3 is a view illustrating a band diagram corresponding to the first blue light emitting layer of FIG. 2 and adjacent layers thereto.

FIG. 1 is a cross-sectional view illustrating an organic light emitting diode in accordance with the present disclosure. Further, FIG. 2 is a view illustrating the configuration of a first or second blue light emitting layer, and FIG. 3 is a view illustrating a band diagram corresponding to the first blue light emitting layer of FIG. 2 and adjacent layers thereto.

As exemplarily shown in FIG. 1, the organic light emitting diode in accordance with the present disclosure includes a first electrode 110 provided in each of a first region SP1, a second region SP2 and a third region SP3, a first common layer CML1 provided on the first electrodes 110, a first red light emitting layer 130 and a first green light emitting layer 135 respectively provided in the first region SP1 and the second region SP2, a first blue light emitting layer 140 provided on the first red light emitting layer 130, the first green light emitting layer 135 and the first common layer CML1 throughout the first to third regions SP1, SP2 and SP3, a charge generation layer 150 provided on the first blue light emitting layer 140, a second common layer CML2 provided on the charge generation layer 150, a second red light emitting layer 160 and a second green light emitting layer 165 respectively provided on the second common layer CML2 in the first region SP1 and the second region SP2, a second blue light emitting layer 170 provided on the second red light emitting layer 160, the second green light emitting layer 165 and the second common layer CML2 throughout the first to third regions SP1, SP2 and SP3, a third common layer CML3 provided on the second blue light emitting layer 170, and a second electrode 180 provided on the third common layer CML3. In some cases, the first blue light emitting layer 140 may be in contact with the charge generation layer 150.

As such, the organic light emitting diode in accordance with the present disclosure has a plurality of stacks, i.e., a first stack S1 and a second stack S2, with the charge generation layer 150 interposed therebetween, between the first electrode 110 and the second electrode 180, and has a light emitting layer structure in each of the first and second stacks S1 and S2, thereby having improved luminous efficiency and lifespan, as compared to an organic light emitting diode having a single stack.

Here, in the light emitting layer structures, the respective first and second stacks S1 and S2 over the first to third regions SP1, SP2 and SP3 share the first and second blue light emitting layers 140 and 170, and the first and second stacks S1 and S2 in the first region SP1 and the second region SP2 respectively have the first and second red light emitting layers 130 and 160 and the first and second green light emitting layers 135 and 165, which contact the lower surfaces of the first and second blue light emitting layers 140 and 170.

The organic light emitting diode in accordance with the present disclosure has a two stack structure, in which the light emitting layer structures having the same configuration are repeatedly stacked with the charge generation layer 150 interposed therebetween in each region. The organic light emitting diode in accordance with the present disclosure having such a repeated light emitting layer structure allows the first and second blue light emitting layers 140 and 170 to be shared by the first to third regions SP1, SP2 and SP3 and may thus form the repeated light emitting layer structure through an open mask which is open to a wide active area without high-definition deposition masks, as compared to a structure in which light emitting layers are formed using different high-definition deposition masks according to respective areas, thereby preventing occurrence of warpage or misalignment caused by use of the high-definition deposition masks and thus preventing poor deposition of the first and second blue light emitting layers 140 and 170.

Therefore, in the organic light emitting diode, the first and second blue light emitting layers 140 and 170 are not divisionally formed in the respective regions SP1, SP2 and SP3, and are formed throughout the active area, thus reducing use of high-definition deposition masks. Thereby, yield may be increased.

Further, the first and second blue light emitting layers 140 and 170 provided to contact the first and second red light emitting layers 130 and 160 and the first and second green light emitting layers 135 and 165 transmit energy to adjacent layers emitting light of a long wavelength, i.e., the first and second red light emitting layers 130 and 160 and the first and second green light emitting layers 135 and 165, and assist excitation of light of respective colors in the first and second red light emitting layers 130 and 160 and the first and second green light emitting layers 135 and 165, and thereby, the first and second blue light emitting layers 140 and 170 in the first region SP1 and the second region SP2 contribute to emission of light of other colors (red light and green light), the thicknesses of the red light emitting layers 130 and 160 and the green light emitting layers 135 and 165 are reduced as compared to a structure in which each stack in each region has a single light emitting layer, use of expensive red and green dopants included in the red light emitting layers 130 and 160 and the green light emitting layers 135 and 165 may be reduced, and thus material costs may be reduced.

Further, even if stack regions of the first and second blue light emitting layers 140 and 170 and the first and second red light emitting layers 130 and 160 and first and second green light emitting layers 135 and 165 are formed in the first and second regions SP1 and SP2, excitation energy necessary to emit blue light is higher than excitation energy necessary to emit other colored light, emission zones of the first and second red light emitting layers 130 and 160 and the first and second green light emitting layers 135 and 165 are formed by energy received from the first and second blue light emitting layers 140 and 170, and mixing with blue light may be prevented.

The first electrode 110 may include a reflective electrode, and the second electrode 180 may have a single layer structure including a transparent electrode layer or a transflective electrode layer, or have a stack structure including one selected from the group consisting of a plurality of transparent electrode layers, a plurality of transflective electrode layers, and both transparent electrode and transflective electrode layers. The reflective electrode included in the first electrode 110 may include, for example, one selected from the group consisting of APC (Ag:Pb:Cu), Ag and Al, or an alloy thereof, and, as circumstances require, the first electrode 110 may further include a transparent electrode provided on the upper or lower surface of the reflective electrode. Further, if the second electrode 180 is a transparent electrode, the transparent electrode may be formed of a transparent metal oxide including one selected from the group consisting of indium, titanium, zinc and tin, and, if the second electrode 180 is a transflective electrode, the transflective electrode may be formed of a metal film having a thin thickness to transmit light, and including at least one of Ag, Mg and Yb, or alloy having some thereof.

In the organic light emitting diode in accordance with the present disclosure, red light has a peak wavelength of 600 nm to 650 nm, green light has a peak wavelength of 510 nm to 590 nm, and blue light has a peak wavelength of 440 nm to 490 nm. Since the respective colored lights have the peak wavelengths within the above-described ranges, in addition to visually complete red, green and blue, the red light may include light of a color close to orange, the green light may include light of a color close to yellow or magenta, and the blue light may include light of a color close to cyan, sky blue or deep blue. If lights respectively emitted from the first to third regions SP1, SP2 and SP3 are combined to implement white light, combinations of other colored lights are possible.

The first region SP1 is operated by the principle that output of red light emitted by recombination between electrons and holes in the first red light emitting layer 130 and the second red light emitting layer 160 is increased through a microcavity effect between the first electrode 110 and the second electrode 180. Here, in the first region SP1, the first blue light emitting layer 140 and the second blue light emitting layer 170 are also light emitting layers, but energy necessary to excite the first blue light emitting layer 140 and the second blue light emitting layer 170 is higher than energy necessary to excite the first red light emitting layer 130 and the second red light emitting layer 160 and thus, the first and second blue light emitting layers 140 and 170 serve only to transmit electrons to the first and second red light emitting layers 130 and 160 and do not emit light. Further, the red light finely resonates between the first electrode 110 which is reflective and the second electrode 180 which is transparent or transflective and is emitted in the upward direction, an optical distance is set to form the emission zones in the first and second red light emitting layers 130 and 160 between the first and second electrodes 110 and 180, and thus mixing with blue light is prevented. Red light has a relatively long optical distance, the organic light emitting diode in accordance with the present disclosure has a simplified layer structure while maintaining high efficiency and does not have an auxiliary hole transport layer divided according to subpixels, and, in order to set the emission zones, the first and second red light emitting layers 130 and 160 have greater thicknesses than those of the first and second green light emitting layers 135 and 165 and the first and second blue light emitting layers 140 and 170 provided in other regions SP2 and SP3. The thicknesses of the first and second red light emitting layers 130 and 160 are about 400 Å to 800 Å.

Similarly, the second region SP2 is operated by the principle that output of green light emitted by recombination between electrons and holes in the first green light emitting layer 135 and the second green light emitting layer 165 is increased through the microcavity effect between the first electrode 110 and the second electrode 180. In this case, the first and second green light emitting layers 135 and 165 have less thicknesses than those of the first and second red light emitting layers 130 and 160, and the thicknesses of the first and second green light emitting layers 135 and 165 are about 200 Å to 400 Å.

The first blue light emitting layer 140 and the second blue light emitting layer 170 serve as electron transport layers in the first and second regions SP1 and SP2 and serve as both light emitting layers and electron transport layers in the third region SP3, and, for this purpose, a first host bh1 to form excitons in the first and second blue light emitting layers 140 and 170 in the third region SP3, a second host bh2 to transport electrons from the first charge generation layer 150 and a blue dopant bd are used together. Here, the first blue light emitting layer 140 directly contacts the charge generation layer 150 and thus an electron transport layer in the first stack S1 may be omitted.

In the second stack S2, although an electron transport layer located in the third common layer CML3 may be omitted due to use of the second blue light emitting layer 170, in order to improve electron injection characteristics of the third common layer CML3 adjacent to the second electrode 180 and to lower driving voltage, the electron transport layer may be provided in the second stack S2.

The charge generation layer 150 has a bilayer structure including an n-type charge generation layer (nCGL) 150a having an n-type dopant in a host material having high electron mobility and a p-type charge generation layer 150b having a p-type dopant in a host material having high hole mobility, and the n-type dopant and the p-type dopant change Fermi levels of the respective host materials and thus serve to allow electrons and holes to be transceived therebetween and to flow into the adjacent stacks S1 and S2. In this case, the charge generation layer 150 serves as a cathode with regard to the first stack S1 and an anode with regard to the second stack S2, i.e., functions as electrodes in organic stacks having no electrodes, and transmits electrons and holes to the respective layers of the adjacent stacks S1 and S2 so as to form excitons in the red light emitting layers 130 and 160, green light emitting layers 135 and 165, and blue light emitting layers 140 and 170 of the corresponding stacks S1 and S2.

As such, a structure in which one subpixel includes two stacks with the charge generation layer 150 interposed therebetween may have high efficiency and lifespan, as compared to a general single stack structure. However, as the elements of the stacks are increased and a configuration for patterning each subpixel (each region) is required, a high-definition deposition mask is used and, as the number of layers of the stacks is increased, the number of required organic deposition chambers is increased.

In order to overcome the above problems, the organic light emitting diode in accordance with the present disclosure has the blue light emitting layers, which are not divided according to subpixels and are integrally provided throughout the active area, and has both an excitable host and a host having an electron transporting function in the blue light emitting layers so that the blue light emitting layers serve to emit blue light in the third region in which only the blue light emitting layers alone are provided and serve as electron transport layers in the vertical direction in the entirety of the active area and, thus, separate electron transport layers are omitted.

The first common layer CML1, the second common layer CML2 and the third common layer CML3 are successively provided throughout the first to third regions SP1, SP2 and SP3 without disconnection and are thus referred to as 'common layers', and each thereof may have a single layer structure or a multilayer structure including a plurality of layers having various functions, as needed. In general, common layers perform a function of transporting holes or electrons between an electrode and a light emitting layer or between a light emitting layer and a charge generation layer. The first common layer CML1 includes a hole injection layer 115 and a first hole transport layer (HTL1) 120, the second common layer CML2 includes a second hole transport layer 155, and the third common layer CML3 includes an electron transport layer 173 and an electron injection layer 175. Further, the common layers CML1, CML2 and CML3 are formed of organic materials. As circumstances require, the electron injection layer 175 contacting the second electrode 180 is formed of a combination of an inorganic compound and a metal and, in this case, the metal is a metal included in the second electrode 180 and thus an electron injection barrier may be lowered.

Further, a capping layer 190 formed on the second electrode 180 has a function of protecting the upper surface of the organic light emitting diode and improving light extraction, includes an organic material, and is formed in the final stage of manufacture of the organic light emitting diode.

The elements between the first electrode 110 and the second electrode 180 are all organic layers, and, as the number of patterning these layers and the number of deposited layers increase, alignment of the respective layers is required, and a defect rate generated in misalignment may reduce yield and raise material costs.

Hereinafter, the configuration of the light emitting layer structure and modifications thereof will be descried in detail.

As exemplarily shown in FIG. 2, the first and second blue light emitting layers 140 and 170 may be configured such that the first host bh1 to form excitons in the first and second blue light emitting layers 140 and 170 in the third region SP3 and the second host bh2 to transport electrons from the first charge generation layer 150 are used together, and particularly, the first blue light emitting layer 140 of the first stack S1 contacts the first charge generation layer 150.

Therefore, an electron transport layer in the first stack S1 may be omitted. In this case, an interlayer interfacial barrier between the first and second electrodes 110 and 180 may be reduced owing to omission of the electron transport layer, and thereby, driving voltage taken to drive the organic light emitting diode may be lowered.

The organic light emitting diode in accordance with the present disclosure may reduce use of organic layers owing to omission of the electron transport layer, thus reducing material costs. Even if the electron transport layer is omitted, at least the first blue light emitting layer 140 may function as the electron transport layer according to change in the compositions of the hosts bh1 and bh2 of the first and second blue light emitting layers 140 and 170, and thus, efficiencies of respective colored lights may be maintained and, in particular, efficiency of blue light may be rather increased.

For this purpose, as exemplarily shown in FIG. 3, the first blue light emitting layer 140 includes the first host bh1 related to excitation, the second host bh2 having an electron transporting property, and the blue dopant bd.

The first host bh1 is a compound which uses anthracene as a host material and performs a function of assisting excitation of the blue dopant, in the same manner as a host which is provided in a general blue light emitting layer.

The second host bh2 has a highest occupied molecular orbital (HOMO) level which is similar to the HOMO level of the first host bh1 and a LUMO level which is higher than the LUMO level of the first host bh1, the LUMO level of the second host bh2 is similar to the LUMO level of the adjacent charge generation layer 150 (in FIG. 1) and thus the second host bh2 may reduce a barrier when electrons enter the first blue light emitting layer 140 and improve electron injection efficiency. Since the first blue light emitting layer 140 contacts the charge generation layer 150 and is provided in common in the first to third regions SP1, SP2 and SP3, electron injection characteristics from the charge generation layer 150 to the first blue light emitting layer 140 in the respective regions SP1, SP2 and SP3 may be similar. Further, the second blue light emitting layer 170 may use the same first and second hosts bh1 and bh2 as those in the first blue light emitting layer 140.

Here, the LUMO level of the second host bh2 may be higher than the LUMO level of the first host bh1 by 0.2 eV to 0.5 eV.

In the organic light emitting diode in accordance with the present disclosure, the first host bh1 and the second host bh2 in the first and second blue light emitting layers 140 and 170 are expressed as chemical formula 4 below. Here, substituents corresponding to R1 to R10 include fused aromatic rings or heterocyclic rings, and four or fewer of R1 to R10 include heterocyclic rings.

The LUMO level of the second host bh2 is relatively higher than the LUMO level of the first host bh1, and this means that the electron injection barrier of the second host bh2 is low and thus means that the second host bh2 contributes to transport of electrons in the first to third regions SP1, SP2 and SP3.

[Chemical formula 4]

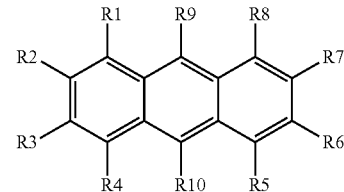

Further, the first and second blue light emitting layers 140 and 170 may respectively include 30 vol % or more of each of the first and second hosts bh1 and bh2 with respect to the first and second blue light emitting layers 140 and 170 so as to sufficiently assist excitation and contribute to transport of electrons.

Further, in order to secure an emission zone fitting into red light having a long wavelength, the first red light emitting layer 130 may have a greater thickness than thicknesses of the first green light emitting layer 135 and the first blue light emitting layer 140, and the second red light emitting layer 160 may have a greater thickness than thicknesses of the second green light emitting layer 165 and the second blue light emitting layer 170.

Here, the thicknesses of the first and second blue light emitting layers 140 and 170 which are thinnest in the light emitting structures may be within a range from 150 Å to 400 Å.

The thickness of the first green light emitting layer 135 may not be less than the thickness of the first blue light emitting layer 140 and be 400 Å or less, and the thickness of the second green light emitting layer 165 may not be less than the thickness of the second blue light emitting layer 170 and be 400 Å or less.

The effects of the organic light emitting diode in accordance with the present disclosure will be described by comparing the organic light emitting diode in accordance with the present disclosure with organic light emitting diodes in accordance with comparative examples.

Figure 4A:
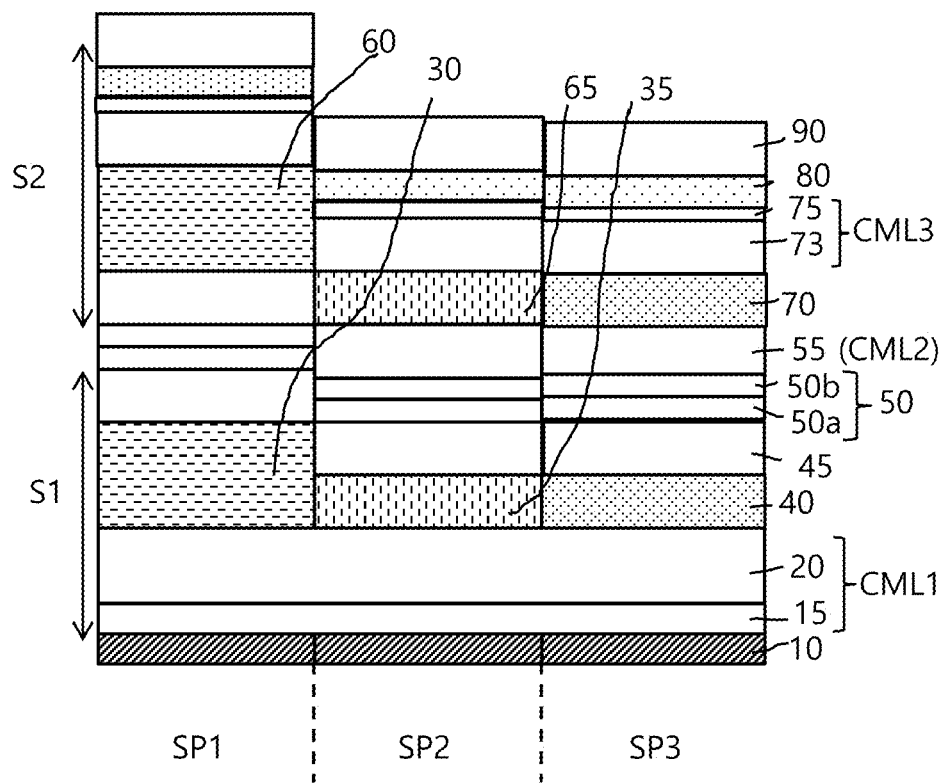
FIG. 4A is a cross-sectional view illustrating an organic light emitting diode in accordance with a first comparative example.
Figure 4B:
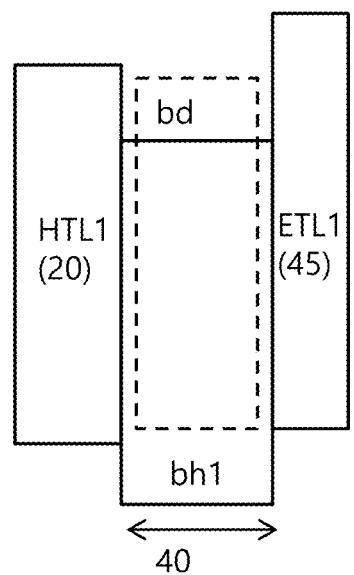
FIG. 4B is a view illustrating a band diagram corresponding to a blue light emitting layer of FIG. 4A and adjacent layers thereto.

FIG. 4A is a cross-sectional view illustrating an organic light emitting diode in accordance with a first comparative example, and FIG. 4B is a view illustrating a band diagram corresponding to a blue light emitting layer of FIG. 4A and adjacent layers thereto.

As exemplarily shown in FIG. 4A, in the organic light emitting diode in accordance with the first comparative example, a first electrode 10, a hole injection layer 15, a first hole transport layer 20, a first light emitting layer 30, 35 or 40, a first electron transport layer 45, a charge generation layer 50, a second hole transport layer 55, a second light emitting layer 60, 65 or 70, a second electron transport layer 73, an electron injection layer 75 and a second electrode 80 and a capping layer 90 are formed in each of first to third regions SP1, SP2 and SP3. The charge generation layer 50 has a bilayer structure including an n-type charge generation layer 50a and a p-type charge generation layer 50b. The organic light emitting diode in accordance with the first comparative example differs from the above-described organic light emitting diode in accordance with the present disclosure in that the organic light emitting diode in accordance with the first comparative example includes the first and second blue light emitting layers 40 and 70 having a different composition from that of the first and second blue light emitting layers 140 and 170 of the present disclosure and further includes the first electron transport layer 45 in a first stack S1.

Here, the first and second blue light emitting layers 40 and 70 include a first host bh1 to excite blue light and a blue dopant bd. That is, the first and second blue light emitting layers 40 and 70 include a single host bh1 and the blue dopant bd.

In this case, as exemplarily shown in FIG. 4B, in the first comparative example, the LUMO level of the first host bh1 is lower than the LUMO level of the first electron transport layer ETL1 45 by 0.5 eV or more and thus acts as a high energy barrier, when electrons are transmitted from the first electron transport layer 45 to the first blue light emitting layer 40, thereby lowering electron transfer characteristics.

Figure 5A:
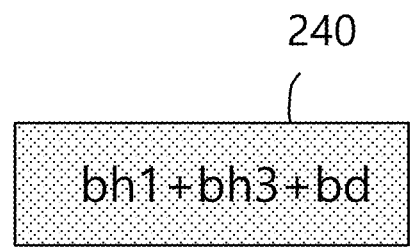
FIG. 5A is a view illustrating the composition of a blue light emitting layer of an organic light emitting diode in accordance with a second comparative example.
Figure 5B:
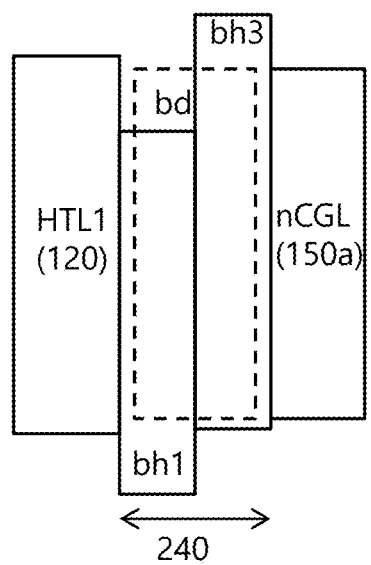
FIG. 5B is a view illustrating a band diagram corresponding to the blue light emitting layer of FIG. 5A and adjacent layers thereto.

FIG. 5A is a view illustrating the composition of a blue light emitting layer of an organic light emitting diode in accordance with a second comparative example, and FIG. 5B is a view illustrating a band diagram corresponding to the blue light emitting layer of FIG. 5A and adjacent layers thereto.

As exemplarily shown in FIGS. 5A and 5B, the organic light emitting diode in accordance with the second comparative example has the same configuration as that of the organic light emitting diode in accordance with the present disclosure shown in FIG. 1 except for the composition of first and second blue light emitting layers, and the first and second blue light emitting layers of the organic light emitting diode in accordance with the second comparative example include an excitable first host bh1, a third host bh3 formed of an electron transporting material ETM and a blue dopant bd. In this composition, the third host bh3 is formed of the same material as an electron transport layer of a second stack S2, and the third host bh3 and the first host bh1 are included in the blue light emitting layer 240. In this case, in the second comparative example, an electron transport layer in a first stack S1 is omitted.

Hereinafter, effects of the organic light emitting diode in accordance with the present disclosure and the organic light emitting diodes in accordance with the first and second comparative examples will be compared through Table 1 and FIG. 6.

In the following test, the first host bh1 assisting the excitation function of the blue light emitting layer, which is used in common in the blue light emitting layers in accordance with the present disclosure and the first and second comparative examples, is a compound expressed as chemical formula 5 below, which includes naphthalene at a terminal thereof centering around anthracene. In the following test, the compound expressed as chemical formula 5 below was used as the first host bh1.

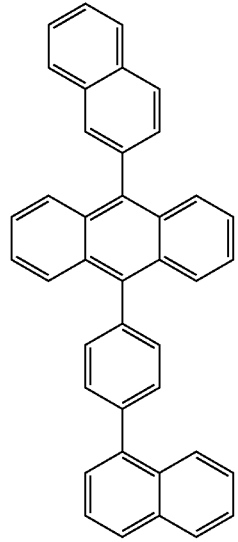

[Chemical formula 5]

As the second host bh2 used in the blue light emitting layers in accordance with the present disclosure, a compound expressed as Chemical formula 2 below was used. Such a compound includes dibenzofuran at a terminal thereof centering around anthracene. That is, the second host bh2 is a compound comprising anthrancene as a core and dibenzofuran as a terminal group.

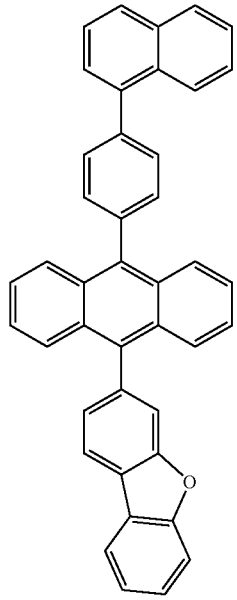

[Chemical Formula 2]

If the second host bh2 includes a compound expressed as Chemical formula 1, or Chemical formula 3 or Chemical formula 6 below, other than the compound expressed as Chemical formula 2, test results equal to or greater than test results acquired by using the compound expressed as Chemical formula 2 may be acquired.

[Chemical formula 1]

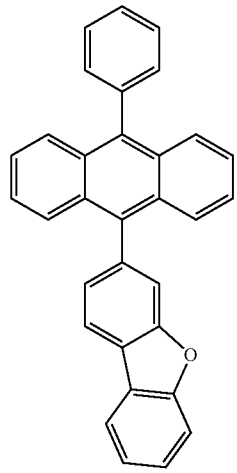

[Chemical formula 3]

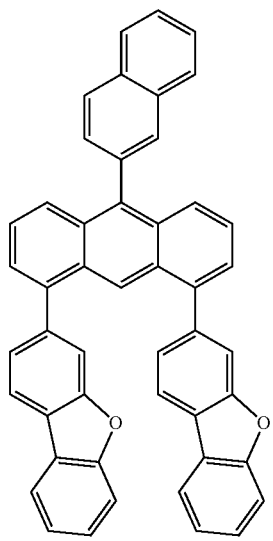

[Chemical formula 6]

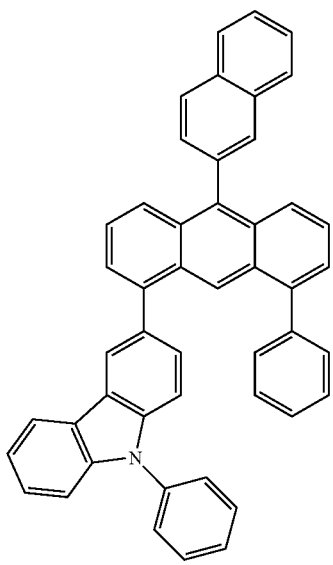

TABLE 1

| Structure | Color of emitted light | Driving voltage (V) | Efficiency (Cd/A comparison) (%) | Luminance (Cd/m²) (nit comparison) (%) | CIEx | CIEy |
|---|---|---|---|---|---|---|
| First comparative example | B | 7.0 | 100 | 100 | 0.140 | 0.059 |
| | G | 6.6 | 100 | 100 | 0.240 | 0.709 |
| | R | 7.4 | 100 | 100 | 0.685 | 0.313 |
| Modification of first comparative example | B | 6.7 | 85 | 85 | 0.142 | 0.057 |
| | G | 7.1 | 81 | 80 | 0.243 | 0.699 |
| | R | 7.6 | 91 | 92 | 0.687 | 0.310 |
| Second comparative example | B | 6.1 | 53 | 53 | 0.133 | 0.091 |
| | G | 5.8 | 114 | 115 | 0.285 | 0.681 |
| | R | 6.4 | 98 | 98 | 0.690 | 0.308 |
| Example of present disclosure | B | 6.8 | 105 | 104 | 0.139 | 0.065 |
| | G | 6.6 | 110 | 120 | 0.271 | 0.689 |
| | R | 7.5 | 98 | 106 | 0.690 | 0.307 |

In Table 1 above, the first comparative example indicates test results of the structure shown in FIGS. 4A and 4B, the modification of the first comparative example indicates test results of a structure acquired by omitting the electron transport layer from the first stack in the configuration of the FIG. 4A, the second comparative example indicates test results of the structure shown in FIGS. 5A and 5B, and the example of the present disclosure indicates test results of the structure shown in FIGS. 1 to 3. The organic light emitting diodes in accordance with the first comparative example, the modification of the first comparative example, the second comparative example and the example of the present disclosure have the following basic structure.

In the test, the organic light emitting diode in accordance with the example of the present disclosure was manufactured according to the configuration of FIG. 1. The first electrode 110 was formed of ITO (70 Å)/APC (1000 Å)/ITO (70 Å), the hole injection layer 115 in the first stack S1 was formed to have a thickness of 50 Å, the hole transport layer 120 was formed of N,N-dinaphthyl-N,N'-diphenylbenzidine (NPD) to have a thickness of 400 Å and, as the light emitting structure, the first red light emitting layer 130 including a red host and a red dopant was formed in the first region SP1 to have a thickness of 550-650 Å, the first green light emitting layer 135 including a green host and a green dopant was formed in the second region SP2 to have a thickness of 300-400 Å, and the first blue light emitting layer including the above-described first host bh1 and second host bh2 and the blue dopant was formed over the first to third regions SP1, SP2 and SP3 to have a thickness of 300-350 Å. Subsequently, as the charge generation layer 150, the n-type charge generation layer 150a having a thickness of 150 Å and the p-type charge generation layer 150b having a thickness of 60 Å were stacked.

Further, on the charge generation layer 150, the second hole transport layer 155 in the second stack S2 was formed, and the second red light emitting layer 160, the second green light emitting layer 165 and the second blue light emitting layer 170 were formed in the same manner as the light emitting layers 130, 135 and 140 in the first stack S1. Subsequently, the electron transport layer 173 was formed of an anthracene-based compound and a lithium quinolate (LiQ) compound to have a thickness of 300 Å, the electron injection layer 175 was formed of Mg:LiF in a ratio of 1:1 to have a thickness of 30 Å, and then the second electrode 180 was formed of Ag:Mg in a ratio of 3:1 to have a thickness of 160 Å.

In the test, the first and second red light emitting layers 130 and 160 respectively included 7 wt % of the red dopant, the first and second green light emitting layers 135 and 165 respectively included 15 wt % of the green dopant, and the first and second blue light emitting layers 140 and 170 respectively included 3 wt % of the blue dopant. These dopant contents are only one embodiment, and may be varied within the range of 20 wt %.

The organic light emitting diode according to the first comparative example differs from the organic light emitting diode according to the example of the present disclosure in that the first blue light emitting layer 40 is restrictively provided only in the third region SP3, the first blue light emitting layer 40 and the second blue light emitting layer 70 include the first host bh1 alone as a host, and the electron transport layer 45 formed of a anthracene-based compound and a LiQ compound and having a thickness of 300 Å is additionally provided in the first stack S1.

The organic light emitting diode according to the modification of the first comparative example has a structure in which the electron transport layer 45 in the first stack S1 is omitted from the structure of the organic light emitting diode according to the first comparative example.

The organic light emitting diode according to the second comparative example has the same configuration as the organic light emitting diode according to the example of the present disclosure except that the first and second blue light emitting layers of the organic light emitting diode according to the second comparative example include the third host bh3 formed of the same material as the electron transport layer of the second stack S2 in addition to the first host bh1 related to excitation.

In Table 1, efficiency and luminance are represented through comparison with values of the first comparative example for convenience in understanding. That is, on the assumption that efficiencies and luminances of blue, green and red lights in the organic light emitting diode according to the first comparative example are 100%, respective values in the organic light emitting diodes according to the modification of the first comparative example, the second comparative example and the example of the present disclosure are represented. If a value is greater than the efficiency or the luminance in the first comparative example, the value shows excellent characteristics and, if a value is less than the efficiency or the luminance in the first comparative example, the value shows poor characteristics.

In detail, it may be confirmed that, if the example of the present disclosure was applied, even though the electron transport layer in the first stack is omitted, as compared to the first comparative example, driving voltage necessary to emit blue light was reduced and luminance characteristics of blue light were improved. Further, driving voltage necessary to emit green light was maintained at the same level and luminance characteristics of green light were improved, as compared to the first comparative example. Moreover, driving voltage necessary to emit red light was raised by 0.1 V but luminance characteristics of red light were improved, as compared to the first comparative example, and it means that, if the example of the present disclosure was applied, characteristics of red light were similar to or higher than those of the first comparative example.

A significant meaning of application of the example of the present disclosure is that use of high-definition deposition masks is reduced and thus yield of a designated level or more may be secured by omitting the electron transport layer from one stack structure and applying the blue light emitting layer to the respective stacks without patterning according to subpixels.

In the organic light emitting diode according to the modification of the first comparative example in Table 1, in which the same blue light emitting layers as in the first comparative example are applied and the electron transport layer is omitted from the first stack, it may be confirmed that driving voltage increase and luminance decline in the first region provided with two stacked red light emitting layers and the second region provided with two stacked green light emitting layers were apparent. The organic light emitting diode according to the example of the present disclosure may secure luminance characteristics which are equivalent to or higher than those of the organic light emitting diode according to the first comparative example and, in particular, reduce driving voltage of blue light, even though the electron transport layer is omitted.

In the organic light emitting diode according to the second comparative example in Table 1, in which blue light emitting layers include a material used as the electron transport layer in addition to the excitable host, luminance efficiency of blue light was reduced to half that of the organic light emitting diode according to the example of the present disclosure, and thus, it may be understood that, when the material of the electron transport layer is used as a host, excitation efficiency of holes/electrons in the blue light emitting layers is lowered. Therefore, it may be expected that, if such an organic light emitting diode is implemented as a display device, the display device will not emit blue light as time passes.

On the other hand, it may be confirmed that the organic light emitting diode according to the example of the present disclosure uses the excitable first host and the second host formed of an electron transporting material having a specific LUMO energy level difference with the first host and thus the second host contributes to transport of electrons without deterioration of the function of the first host. Further, color characteristics of blue, green and red lights were uniformly improved without remarkable degradation or enhancement of a specific color, and it may be expected that the organic light emitting diode according to the example of the present disclosure shows stable characteristics in spite of driving for a long time.

Figure 6:
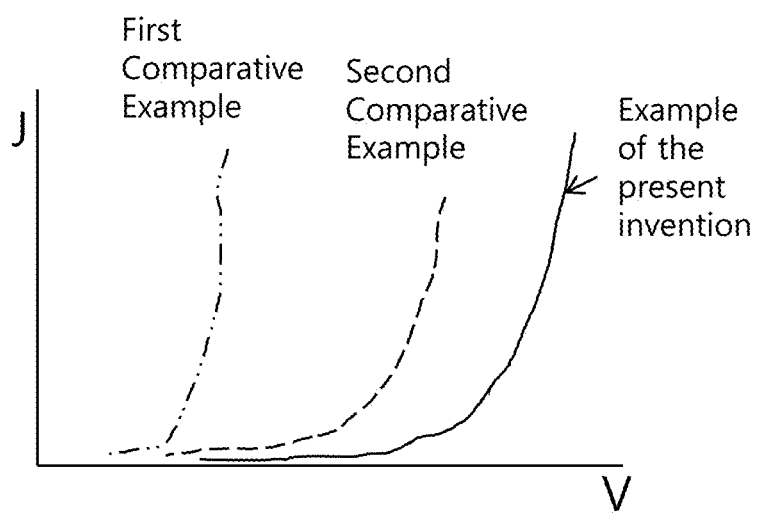
FIG. 6 is a graph illustrating current-voltage (J-V) characteristics of test examples.

FIG. 6 is a graph illustrating current-voltage (J-V) characteristics of test examples.

In a J-V curve, only if there is a designated section of a region in which a slope is gentle, gradations may be expressed. As shown in FIG. 6, the organic light emitting diode according to the example of the present disclosure represents a J-V curve having the gentlest slope, and it means that the organic light emitting diode according to the example of the present disclosure may sufficiently express gradations.

Hereinafter, a first deposition mask 250 used to form the first and second red light emitting layers 130 and 160 or the first and second green light emitting layers 135 and 165 and a second deposition mask 230 used to form the first and second blue light emitting layers 140 and 170 in accordance with the present disclosure will be compared.

Figure 7A:
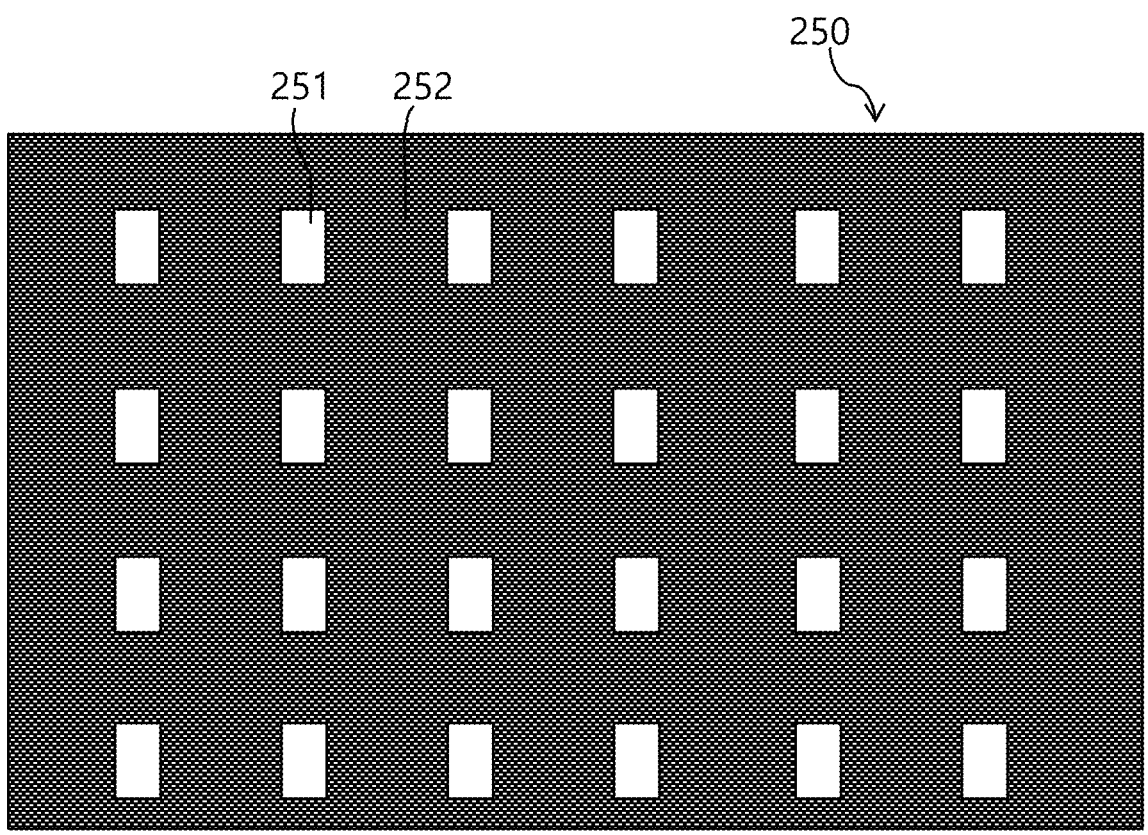
FIG. 7A is a plan view illustrating a first deposition mask to form a red light emitting layer or a green light emitting layer of the organic light emitting diode in accordance with the present disclosure.
Figure 7B:
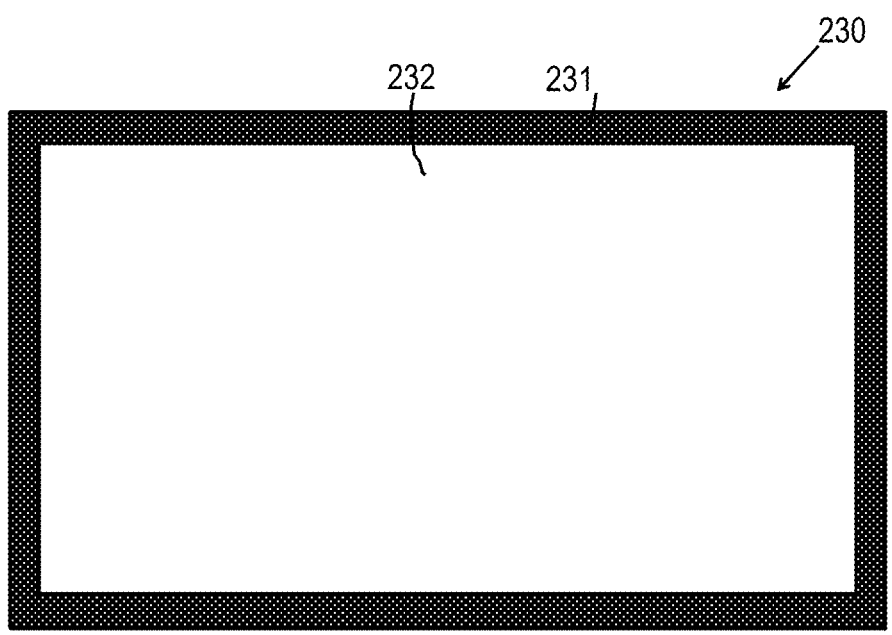
FIG. 7B is a plan view illustrating a second deposition mask to form a blue light emitting layer of the organic light emitting diode in accordance with the present disclosure.

FIG. 7A is a plan view illustrating the first deposition mask to form the red light emitting layer or the green light emitting layer of the organic light emitting diode in accordance with the present disclosure, and FIG. 7B is a plan view illustrating the second deposition mask to form the blue light emitting layer of the organic light emitting diode in accordance with the present disclosure.

As exemplarily shown in FIG. 7A, the first deposition mask 250 used to form the red light emitting layer or the green light emitting layer, which is divisionally deposited in designated regions of an active area of a substrate, includes first openings 251 formed at regions corresponding to emission zones of first regions SP1 or second regions SP2, and a shielding part 252 formed in the remaining regions. In this case, the first openings 251 have a size which is equal to or less than the size of subpixels, and the first deposition mask 250 is provided to be finely partitioned. Further, each of the first and second red light emitting layers 130 and 160 and the first and second green light emitting layers 135 and 165 formed using the first deposition mask 250 is formed in a shape which is divided to correspond to the respective first openings 251.

As exemplarily shown in FIG. 7B, the second deposition mask 230 positioned to overlie the first to third regions SP1, SP2 and SP3 includes a second opening 232 formed in a region corresponding to all subpixels of a substrate and a shielding part 231 formed at the edge of the substrate. When the first blue light emitting layer 140 or the second blue light emitting layer 170 is formed using the second deposition mask 230, the first or second blue light emitting layer 140 or 170 is integrally formed throughout all the subpixels in the active area of the substrate without disconnection.

Figure 8:
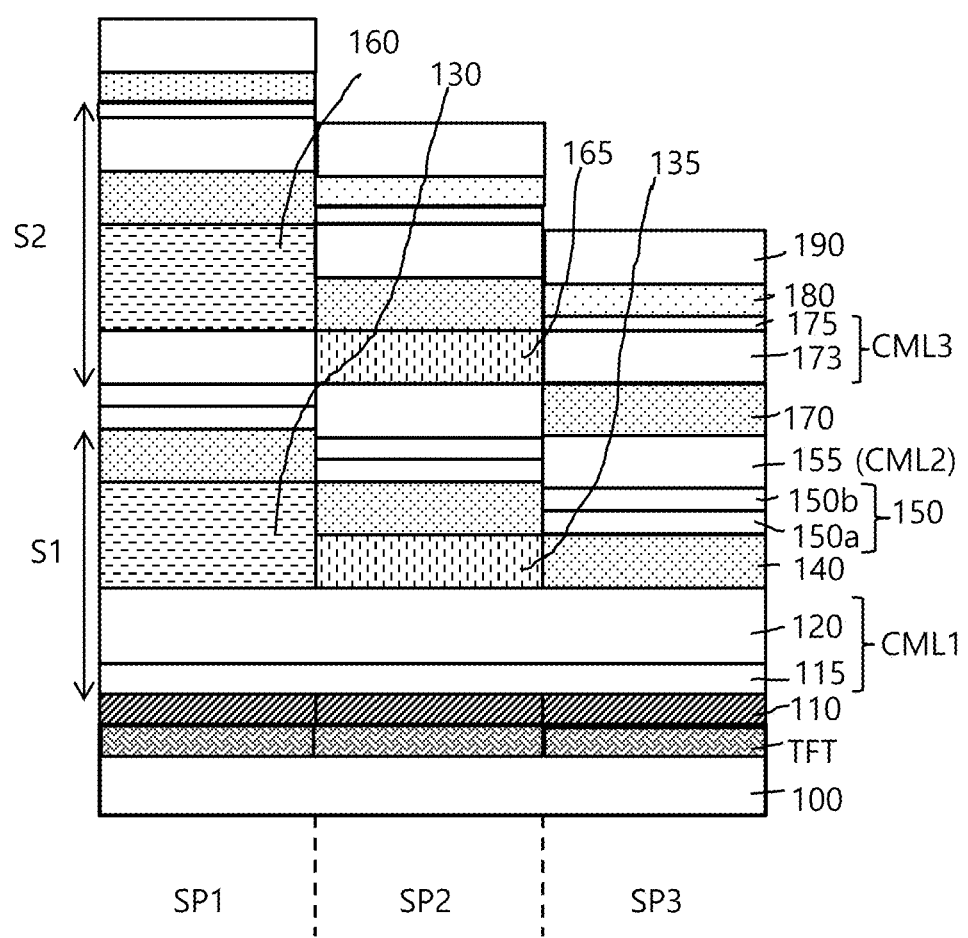
FIG. 8 is a cross-sectional view illustrating an organic light emitting diode display device using the organic light emitting diode in accordance with the present disclosure.

FIG. 8 is a cross-sectional view illustrating an organic light emitting diode display device using the organic light emitting diode in accordance with the present disclosure.

As exemplarily shown in FIG. 8, the organic light emitting diode display device in accordance with the present disclosure has organic light emitting diodes shown in FIG. 1, on a substrate 100, and the first electrode 110 of the organic light emitting diode is connected to a driving thin film transistor TFT provided in the first to third regions (subpixels) SP1 to SP3 of each organic light emitting diode.

Here, although the driving thin film transistor TFT is schematically illustrated, the driving thin film transistor TFT includes a semiconductor layer provided in a designated region of the substrate 100, a gate electrode provided on the semiconductor layer with a gate insulating film interposed therebetween, and source and drain electrodes connected to both sides of the semiconductor layer, and one electrode of the driving thin film transistor TFT is connected to the first electrode 110.

As circumstances require, the organic light emitting diode display device in accordance with the present disclosure may have a two stack structure, as exemplarily shown in this figure, or, in order to further increase luminous efficiency, the organic light emitting diode display device may further include at least one light emitting stack, in which a fourth common layer, a light emitting layer including a combination of a red light emitting layer and a green light emitting layer provided in designated subpixels and a blue light emitting layer provided throughout the respective subpixels, and a fifth common layer are stacked, between the third common layers CML3 and the second electrode 180.

Further, a thin film laminate for encapsulation in which an organic film and an inorganic film are alternately stacked may be provided on the upper surface of the capping layer 190, and an optical film to improve luminance may be further provided at a final emission side of the display device or inside a cover film.

Figure 9:
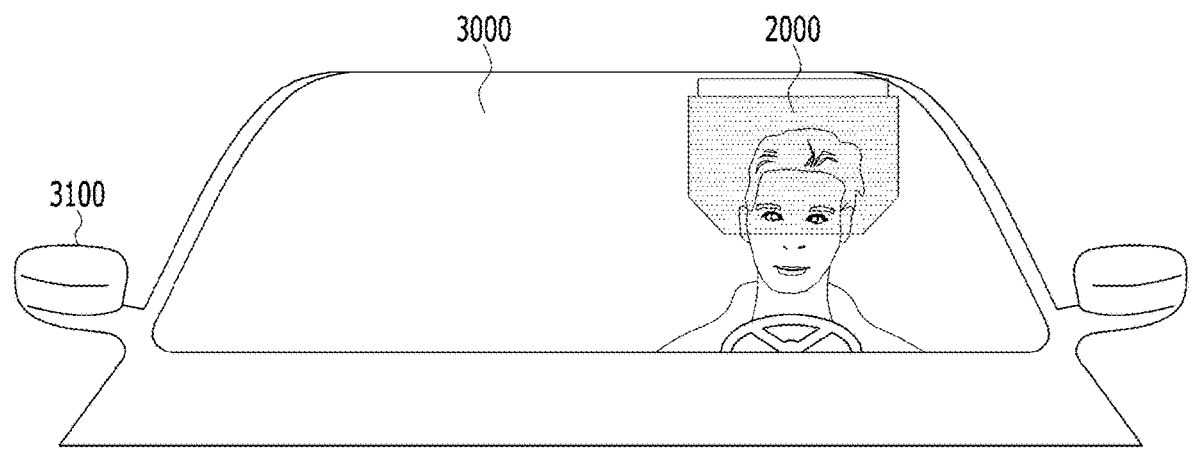
FIG. 9 is a view illustrating a vehicle to which the organic light emitting diode display device in accordance with the present disclosure is applied.

FIG. 9 is a view illustrating a vehicle to which the organic light emitting diode display device in accordance with the present disclosure is applied.

As exemplarily shown in FIG. 9, the organic light emitting diode display device in accordance with the present disclosure may be used under the condition that the substrate 100 is attached to at least one of an instrument panel (not shown), a head-up display 2000 separated from a front glass 3000 so as to be movable, the front glass 3000, a rear view mirror (not shown) or a side view mirror 3100 of the vehicle. In this case, the display device in the vehicle is usable as a device to provide information to a driver.

As the substrate 100 of the organic light emitting diode display device in accordance with the present disclosure, a transparent flexible plastic substrate is used to be easily attached to the inside of the vehicle.

Further, the driving thin film transistor TFT to drive each organic light emitting diode on the substrate 100 may be operated by power received from a battery in the vehicle, and therethrough, the organic light emitting diode may be operated by applied current. In this case, the display device in accordance with the present disclosure has high luminous efficiency even in moving outdoors and may thus display an image to a user at high luminance and have improved visibility. Further, omission of the electron transport layer from the first stack lowers barrier voltage in transport of electrons, raises an electron transport rate, and may thus increase recombination between holes and electrons in the respective light emitting layers even if all the subpixels share the blue light emitting layer, thereby improving luminance characteristics of respective colors of light.

When the organic light emitting diode display device in accordance with the present disclosure is attached to the inside of a vehicle, the organic light emitting diode display device has high luminance, and may thus provide a designated degree or more of luminance characteristics to a driver under external light or dark environments and display an image without obstruction of a driver's field of vision during driving.

As apparent from the above description, an organic light emitting diode, an organic light emitting diode display device and a display device for vehicles using the same in accordance with the present disclosure have effects as follows.

First, in the organic light emitting diode, blue light emitting layers are not divisionally formed in respective subpixels and are integrally formed throughout an active area, and thus use of high-definition deposition masks may be reduced. Thereby, yield may be increased.

Second, the blue light emitting layers contacting red light emitting layers and green light emitting layers transmit energy to adjacent layers emitting light of a long wavelength (i.e., the red light emitting layers and the green light emitting layers) and assist excitation of the red light emitting layers and the green light emitting layers, and thereby, the blue light emitting layers contribute to light emission in red and green subpixels, the thicknesses of the red and green light emitting layers are reduced as compared to a structure in which each stack in each region has a single light emitting layer, i.e., the red or green light emitting layer, use of expensive red and green dopants included in the red and green light emitting layers may be reduced, and thus material costs may be reduced.

Third, even if stack regions between the blue light emitting layers and the other colored light emitting layers are formed, excitation energy necessary to emit blue light is higher than excitation energy necessary to emit other colored light, emission of light of corresponding colors (red light and green light) in regions provided with the other colored light emitting layers is possible by energy received from the blue light emitting layers, and mixing with blue light may be prevented.

Fourth, the blue light emitting layers are configured such that a first host to form excitons in the blue light emitting layers and a second host to transport electrons from a charge generation layer are used together, and particularly, the blue light emitting layer of a first stack contacts the charge generation layer. Therefore, an electron transport layer in the first stack may be omitted. In this case, an interlayer interfacial barrier may be reduced owing to omission of the electron transport layer, and thereby, driving voltage may be lowered.

Fifth, the organic light emitting diode reduces use of organic layers owing to omission of the electron transport layer and may thus reduce material costs. Even if the electron transport layer is omitted, the blue light emitting layer functions as the electron transport layer according to change in the compositions of hosts of the blue light emitting layers, and thus, efficiencies of respective colored lights may be maintained without decline and, in particular, efficiency of blue light may be rather increased.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode comprising:
   a first electrode in each of a first region, a second region and a third region;
   a first common layer on the first electrodes;
   a first red light emitting layer and a first green light emitting layer respectively in the first region and the second region;
   a first blue light emitting layer on the first red light emitting layer, the first green light emitting layer and the first common layer throughout the first to third regions;
   a charge generation layer on the first blue light emitting layer;
   a second common layer on the charge generation layer;
   a second red light emitting layer and a second green light emitting layer respectively on the second common layer in the first region and the second region;
   a second blue light emitting layer on the second red light emitting layer, the second green light emitting layer and the second common layer throughout the first to third regions;
   a third common layer on the second blue light emitting layer; and
   a second electrode on the third common layer,
   wherein at least one of the first blue light emitting layer and the second blue light emitting layer comprises a first host which assists excitation, a second host having an electron transporting property and a blue dopant, and
   wherein a lowest unoccupied molecular orbital (LUMO) level of the second host is higher than a LUMO level of the first host by 0.2 eV to 0.5 eV.

2. The organic light emitting diode according to claim 1, wherein the first blue light emitting layer is in contact with the charge generation layer.

3. The organic light emitting diode according to claim 1, wherein the second host is a compound comprising anthracene as a core and dibenzofuran as a terminal group.

4. The organic light emitting diode according to claim 1, wherein the second host comprises one selected from the group consisting of compounds expressed as Chemical formulas 1 to 3 below,

[Chemical formula 1]

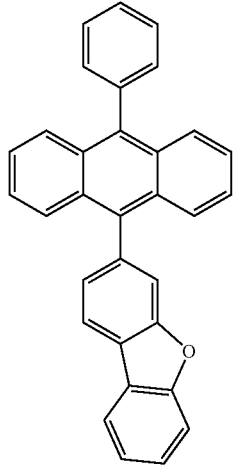

[Chemical formula 2]

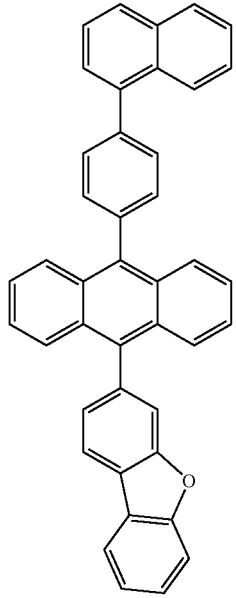

-continued

[Chemical formula 3]

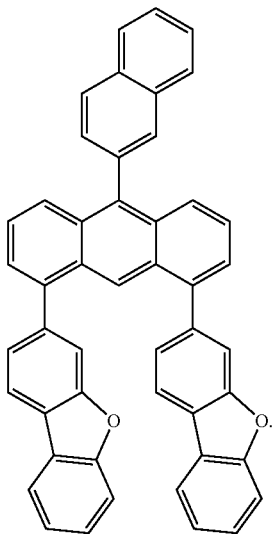

5. The organic light emitting diode according to claim 1, wherein the first and second blue light emitting layers respectively include 30 vol % or more of each of the first and second hosts.

6. The organic light emitting diode according to claim 1, wherein:
the first red light emitting layer has a greater thickness than thicknesses of each of the first green light emitting layer and the first blue light emitting layer; and
the second red light emitting layer has a greater thickness than thicknesses of each of the second green light emitting layer and the second blue light emitting layer.

7. The organic light emitting diode according to claim 6, wherein the thickness of each of the first and second blue light emitting layers is within a range from 150 Å to 400 Å.

8. The organic light emitting diode according to claim 7, wherein:
the thickness of the first green light emitting layer is not less than the thickness of the first blue light emitting layer and is 400 Å or less; and
the thickness of the second green light emitting layer is not less than the thickness of the second blue light emitting layer and is 400 Å or less.

9. The organic light emitting diode according to claim 1, further comprising a capping layer on the second electrode.

10. The organic light emitting diode according to claim 1, wherein the third common layer contacts the second electrode.

11. The organic light emitting diode according to claim 1, wherein lower surfaces of the first red light emitting layer, the first green light emitting layer and the first blue light emitting layer contact an upper surface of the first common layer, in the first to third regions respectively.

12. The organic light emitting diode according to claim 1, further comprising a light emitting stack formed by stacking a fourth common layer, a light emitting structure and a fifth common layer, between the third common layer and the second electrode.

13. The organic light emitting diode according to claim 12, wherein the light emitting structure comprises:
a third red light emitting layer and a third green light emitting layer respectively in the first region and the second region; and
a third blue light emitting layer on the third red light emitting layer, the third green light emitting layer and the fourth common layer throughout the first to third regions.

14. An organic light emitting diode display device comprising:
a substrate provided with a first region, a second region and a third region, each region having a driving thin film transistor;
a first electrode connected to the driving thin film transistor in each of the first region, the second region and the third region;
a first common layer on the first electrodes;
a first red light emitting layer and a first green light emitting layer respectively in the first region and the second region;
a first blue light emitting layer on the first red light emitting layer, the first green light emitting layer and the first common layer throughout the first to third regions;
a charge generation layer on the first blue light emitting layer;
a second common layer on the charge generation layer;
a second red light emitting layer and a second green light emitting layer respectively on the second common layer in the first region and the second region;
a second blue light emitting layer on the second red light emitting layer, the second green light emitting layer and the second common layer throughout the first to third regions;
a third common layer on the second blue light emitting layer; and
a second electrode on the third common layer,
wherein at least one of the first blue light emitting layer and the second blue light emitting layer comprises a first host which assists excitation, a second host having an electron transporting property and a blue dopant, and
wherein a lowest unoccupied molecular orbital (LUMO) level of the second host is higher than a LUMO level of the first host by 0.2 eV to 0.5 eV.

15. The organic light emitting diode display device according to claim 14, wherein the first blue light emitting layer is in contact with the charge generation layer.

16. The organic light emitting diode display device according to claim 15, wherein the second host is a compound comprising anthracene as a core and dibenzofuran as a terminal group.

17. The organic light emitting diode display device according to claim 14, further comprising a capping layer in contact with an upper surface of the second electrode.

18. The organic light emitting diode display device according to claim 17, further comprising an optical film on the capping layer.

19. The organic light emitting diode display device according to claim 14, wherein:
the substrate is a transparent flexible film;
the first electrode includes a reflective electrode; and
the second electrode includes one of a transparent electrode layer, a transflective electrode layer, a stack of a plurality of transparent electrode layers, a stack of a plurality of transflective electrode layers, or a stack of transparent electrode and transflective electrode layers.

20. A display device for vehicles, comprising:
an organic light emitting display device configured to be attached to at least one of an instrument panel, a head-up display, a front glass, a rear view mirror, or a side view mirror of a vehicle, the organic light emitting display device including:
a substrate provided with a first region, a second region and a third region, each region having a driving thin film transistor;
a first electrode connected to the driving thin film transistor in each of the first region, the second region and the third region;
a first common layer on the first electrodes;
a first red light emitting layer and a first green light emitting layer respectively in the first region and the second region;
a first blue light emitting layer on the first red light emitting layer, the first green light emitting layer and the first common layer throughout the first to third regions;
a charge generation layer on the first blue light emitting layer;
a second common layer on the charge generation layer;
a second red light emitting layer and a second green light emitting layer respectively on the second common layer in the first region and the second region;
a second blue light emitting layer on the second red light emitting layer, the second green light emitting layer and the second common layer throughout the first to third regions;
a third common layer on the second blue light emitting layer; and
a second electrode on the third common layer,
wherein the first blue light emitting layer comprises a first host which assists excitation, a second host having an electron transporting property and a blue dopant, and
wherein a lowest unoccupied molecular orbital (LUMO) level of the second host is higher than a LUMO level of the first host by 0.2 eV to 0.5 eV.

21. The display device for vehicles according to claim 20, wherein the driving thin film transistor is configured to receive power from a battery in the vehicle.

22. The display device for vehicles according to claim 20, wherein the first blue light emitting layer is in contact with the charge generation layer.

* * * * *